US012658674B2

(12) United States Patent
Takamure et al.

(10) Patent No.: US 12,658,674 B2
(45) Date of Patent: Jun. 16, 2026

(54) SEMICONDUCTOR OPTICAL DEVICE

(71) Applicant: Lumentum Japan, Inc., Sagamihara (JP)

(72) Inventors: Tetsuyoshi Takamure, Sagamihara (JP); Ryu Washino, Yokohama (JP); Yoshihiro Kojima, Sagamihara (JP); Saori Hizume, Sagamihara (JP)

(73) Assignee: Lumentum Radiant GmbH, Baar (CH)

( * ) Notice: Subject to any disclaimer, the term of this patent is extended or adjusted under 35 U.S.C. 154(b) by 559 days.

(21) Appl. No.: 18/336,806

(22) Filed: Jun. 16, 2023

(65) Prior Publication Data

US 2024/0322527 A1    Sep. 26, 2024

(30) Foreign Application Priority Data

Mar. 20, 2023    (JP) ................................. 2023-043774
Apr. 24, 2023    (JP) ................................. 2023-070872

(51) Int. Cl.
*H01S 5/22*        (2006.01)
*H01S 5/042*       (2006.01)
*H01S 5/227*       (2006.01)
*H01S 5/026*       (2006.01)

(52) U.S. Cl.
CPC .......... *H01S 5/2205* (2013.01); *H01S 5/0425* (2013.01); *H01S 5/227* (2013.01); *H01S 5/0265* (2013.01)

(58) Field of Classification Search
CPC ...... H01S 5/2205; H01S 5/227; H01S 5/2272; H01S 5/2275; H01S 5/2277; H01S 5/0425
See application file for complete search history.

(56) References Cited

U.S. PATENT DOCUMENTS

| | | | | |
|---|---|---|---|---|
| 6,821,801 B1 * | 11/2004 | Sato | ....................... | H01S 5/2231 |
| | | | | 438/22 |
| 11,880,098 B2 * | 1/2024 | Washino | ............... | G02F 1/0155 |
| 12,510,775 B2 * | 12/2025 | Washino | ............... | G02F 1/0155 |
| 2002/0187580 A1 * | 12/2002 | Kondo | .................... | H01S 5/227 |
| | | | | 438/47 |
| 2008/0137703 A1 * | 6/2008 | Iga | ......................... | B82Y 20/00 |
| | | | | 257/E33.011 |

(Continued)

FOREIGN PATENT DOCUMENTS

| | | |
|---|---|---|
| JP | 2010271667 A | 12/2010 |
| JP | 2011151088 A | 8/2011 |

*Primary Examiner* — James A Menefee

(74) *Attorney, Agent, or Firm* — Harrity & Harrity, LLP

(57) ABSTRACT

A semiconductor optical device includes: a mesa-stripe structure extending in a first direction; a pair of buried layers, each buried layer including a first slope surface adjacent to a top surface of the mesa-stripe structure, each buried layer including a first upright surface that stands straight from an upper end of the first slope surface, each buried layer including an upper surface higher than the top surface; an insulating film on the upper surface; and an electrode film over the top surface, the first slope surface, and the insulating film. The first upright surface has an upper end. The upper surface of at least one of the pair of buried layers has recesses. Each recess has a second slope surface that slopes downward from the upper surface. The second slope surface has an upper end that extends along a second direction perpendicular to the first direction.

19 Claims, 15 Drawing Sheets

(56) References Cited

U.S. PATENT DOCUMENTS

2021/0044083 A1* 2/2021 Hayakawa ............ H01S 5/3434
2021/0044091 A1* 2/2021 Mitaki .................. H01S 5/3216
2023/0352911 A1* 11/2023 Nishimura .......... H01S 5/04254

* cited by examiner

SEMICONDUCTOR OPTICAL DEVICE

CROSS-REFERENCE TO RELATED APPLICATIONS

The present application claims priority to Japanese Patent Application Number 2023-043774 filed on Mar. 20, 2023 and to Japanese Patent Application Number 2023-070872 filed on Apr. 24, 2023, the contents of which are hereby incorporated by reference into this application.

TECHNICAL FIELD

The present disclosure relates generally to a semiconductor optical device.

BACKGROUND

A semiconductor optical device with a buried hetero-structure (BH structure) can have a mesa-stripe structure, including a multiple quantum well layer, both sides of which are buried with a semiconductor layer (buried layer). There is an insulating film on an upper surface of the buried layer, and there is an electrode on the insulating film. The insulating film has a through-hole inside which there is a top surface of the mesa-stripe structure, and the electrode is electrically connected to the mesa-stripe structure inside the through-hole.

Upper surfaces of the insulating film and the buried layer have a height difference (a step). The electrode is made thinner on a larger step than on a flat surface. Making the electrode thinner may lead to a higher resistance and a lower heat dissipation, deteriorating characteristics of the semiconductor optical device.

SUMMARY

Some implementations disclosed herein prevent deterioration of characteristics.

In some implementations, a semiconductor optical device includes: a mesa-stripe structure extending in a first direction; a pair of buried layers configured to bury the mesa-stripe structure on both sides, each of the buried layers including a first slope surface that is adjacent to and slopes upward from a top surface of the mesa-stripe structure, each of the buried layers including a first upright surface that stands straight from an upper end of the first slope surface, each of the buried layers including an upper surface that is higher than the top surface of the mesa-stripe structure; an insulating film on the upper surface of each of the pair of buried layers, avoiding the top surface of the mesa-stripe structure; and an electrode film over the top surface of the mesa-stripe structure, the first slope surface, and the insulating film. The first upright surface has an upper end that may extend along the first direction. The upper surface of at least one of the pair of buried layers has some recesses. Each of the recesses has a second slope surface that slopes downward from the upper surface. The second slope surface has an upper end that may extend along a second direction perpendicular to the first direction.

BRIEF DESCRIPTION OF THE DRAWINGS

FIG. 10 is a plan view of a cut-out section of an insulating film in the semiconductor optical device according to variant 2.

DETAILED DESCRIPTION

Figure 1:
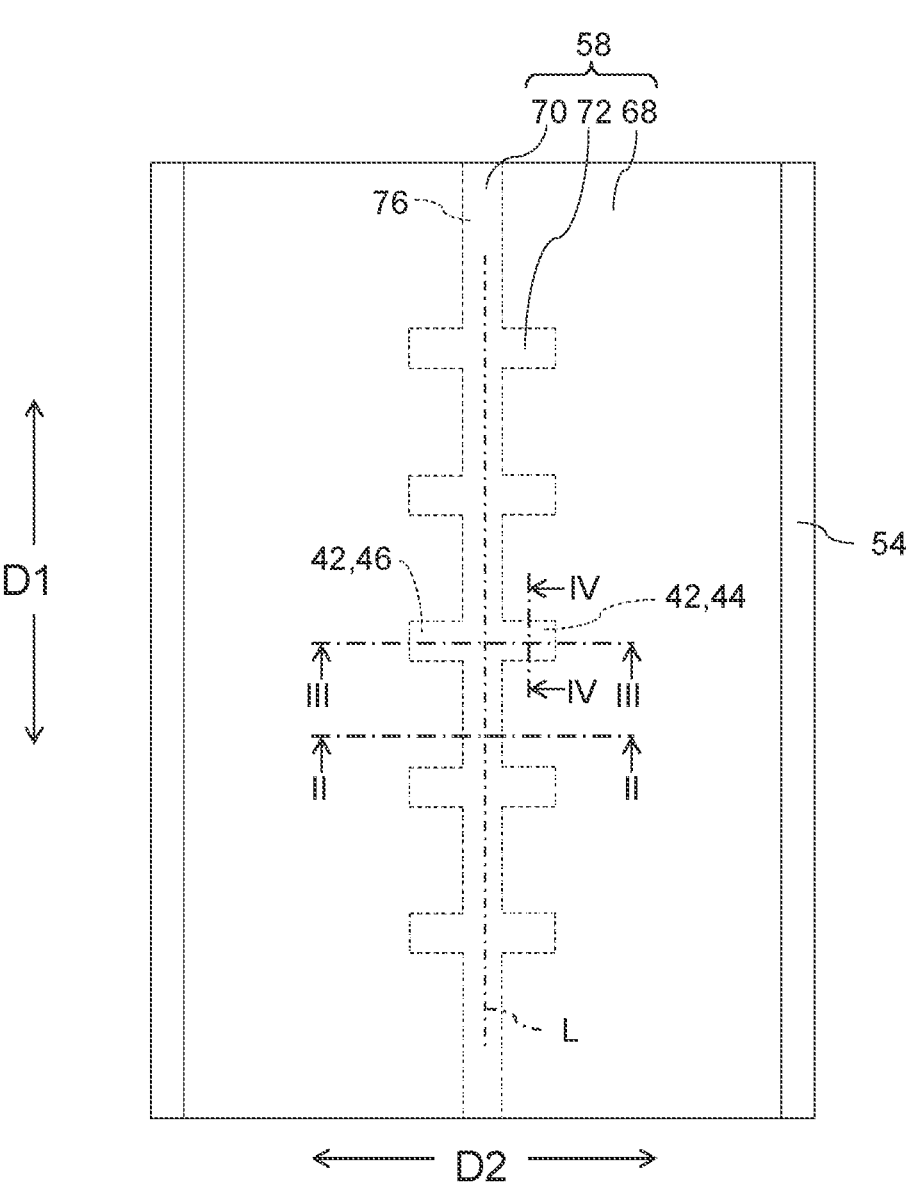
FIG. 1 is a plan view of a semiconductor optical device according to a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
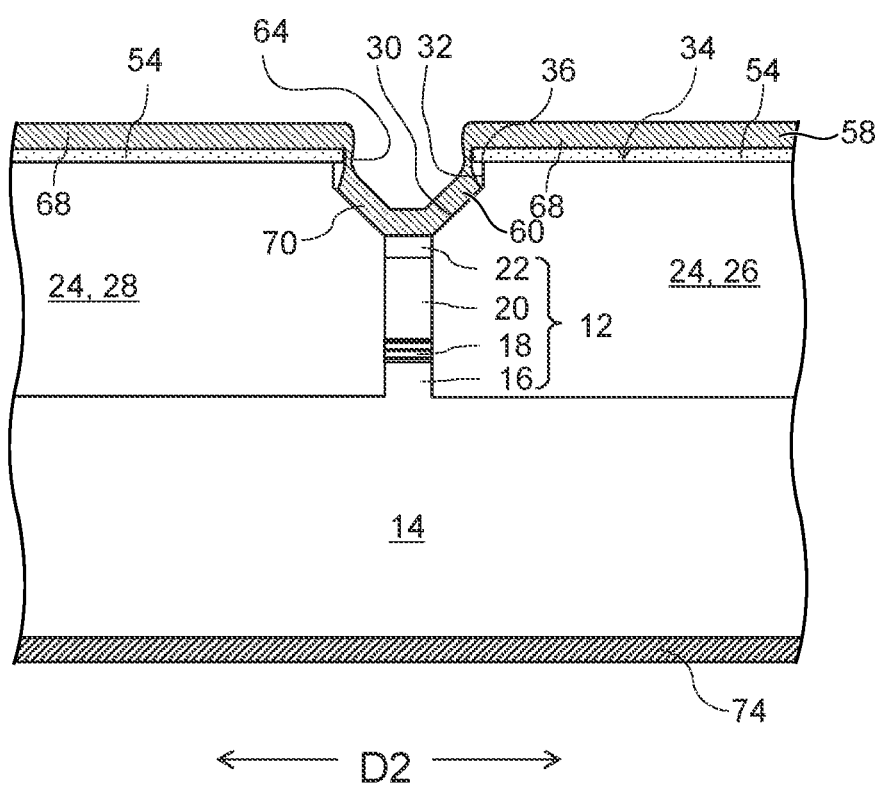
FIG. 2 is a II-II cross-sectional view of the semiconductor optical device in FIG. 1.
Figure 3:
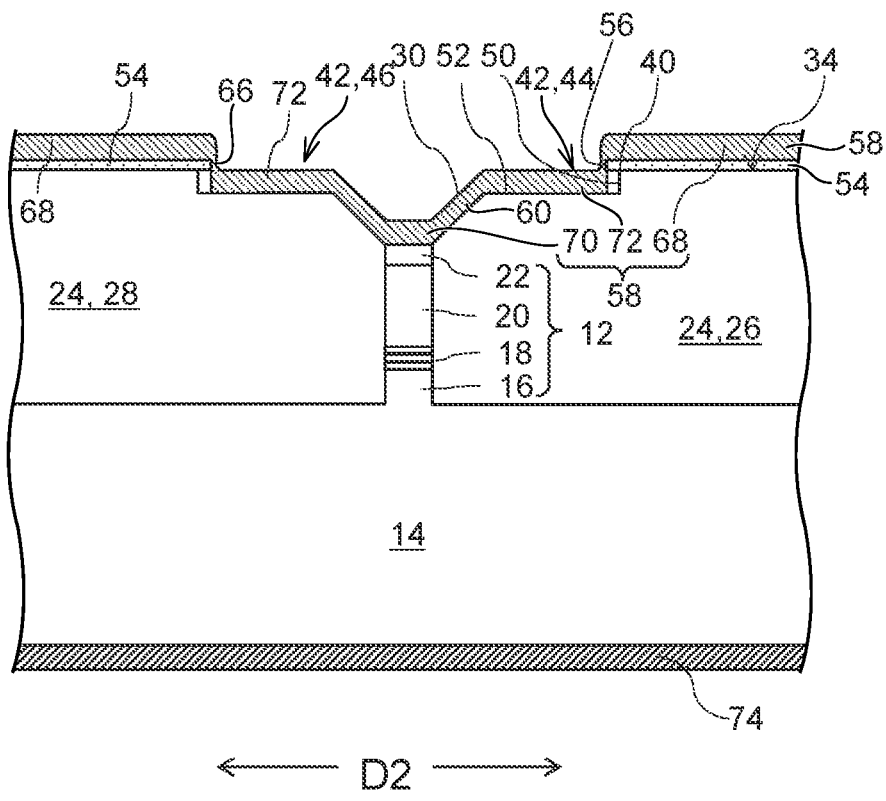
FIG. 3 is a III-III cross-sectional view of the semiconductor optical device in FIG. 1.
Figure 4:
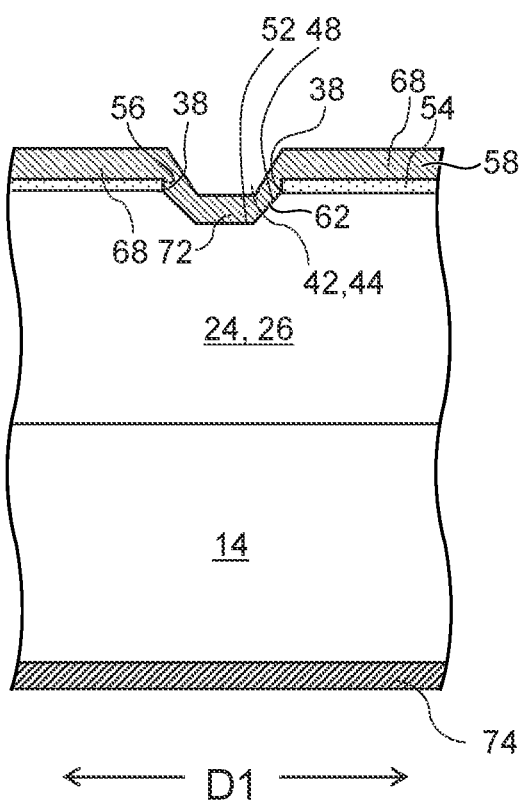
FIG. 4 is a IV-IV cross-sectional view of the semiconductor optical device in FIG. 1.

FIG. 1 is a plan view of a semiconductor optical device according to a first example implementation. FIG. 2 is a II-II cross-sectional view of the semiconductor optical device in FIG. 1. FIG. 3 is a III-III cross-sectional view of the semiconductor optical device in FIG. 1. FIG. 4 is a IV-IV cross-sectional view of the semiconductor optical device in FIG. 1.

The semiconductor optical device may be any one of a semiconductor laser, a semiconductor optical amplifier, an electro-absorption modulator (EA modulator), or a photo-detector. A buried hetero-structure (BH structure) may be included in the semiconductor optical device. The BH structure may be a structure where both sides of a mesa-stripe structure, including a multiple quantum well layer, may be buried with a semiconductor such as a semi-insulating semiconductor layer or some p-n junction semiconductor layers. This allows high reliability and excellent heat dissipation to be achieved.

The semiconductor optical device may have a mesa-stripe structure 12 extending in a first direction D1. A semiconductor substrate 14 (e.g., an n-InP substrate) may have a protrusion 16. The protrusion 16 may comprise a bottom of the mesa-stripe structure 12. The protrusion 16 (semiconductor substrate 14) may serve as an n-type clad layer. Here, the n-type may be a first conductivity type.

The semiconductor optical device may have a multiple quantum well layer 18. The multiple quantum well layer 18 may extend in a single stripe in the first direction D1 on the protrusion 16. The semiconductor optical device may have a p-type clad layer 20. The p-type clad layer 20 (e.g., a p-InP layer) may extend in a single stripe in the first direction D1 on the multiple quantum well layer 18. Here, the p-type may be a second conductivity type. The semiconductor optical device may have a p-type contact layer 22. The p-type contact layer 22 (e.g., a p-InGaAs layer) may extend in a single stripe in the first direction D1 on the p-type clad layer 20. The p-type contact layer 22 may be an uppermost layer of the mesa-stripe structure 12.

Note that another unillustrated layer, such as an optical confinement layer or a diffraction grating layer, may be interposed between the multiple quantum well layer 18 and the protrusion 16 and between the multiple quantum well layer 18 and the p-type clad layer 20. In the example implementation, the first conductivity type may be described as the n-type and the second conductivity type as the p-type, but this may be reversed.

The semiconductor optical device may have a pair of buried layers 24 (e.g., semi-insulating Fe—InP layers). The pair of buried layers 24 may bury the mesa-stripe structure 12 on both sides in the second direction D2 (e.g., perpendicular to the first direction D1). The buried layer 24 may be a single-crystal layer and may be in contact with the mesa-stripe structure 12. The buried layer 24 may have a side surface opposed to a side surface, avoiding a top surface, of the mesa-stripe structure 12. The pair of buried layers 24 may be a first buried layer 26 and a second buried layer 28, being equal in width in the second direction D2.

Each buried layer 24 may have a first slope surface 30. The first slope surface 30 may be adjacent to the top surface of the mesa-stripe structure 12 and may slope upward from the top surface. The first slope surface 30 may be a crystal face.

Each buried layer 24 may have a first upright surface 32. The first upright surface 32 may stand upright from an upper end of the first slope surface 30. The upper end of the first upright surface 32 may extend along the first direction D1. The first upright surface 32 may be a crystal face.

Each buried layer 24 may have an upper surface 34. The upper surface 34 may be higher than the top surface of the mesa-stripe structure 12. The buried layer 24, when comprising multiple layers, may comprise single crystals in a region from the first slope surface 30 to the upper surface 34.

The outer edge of the upper surface 34 may include first edges 36 extending along the first direction D1. The first edges 36 may be spaced apart and arranged in a straight line. The first upright surface 32 may be adjacent to the first edge 36. The outer edge of the upper surface 34 may include a second edge 38 extending along the second direction D2. The second edge 38 may comprise a pair of second edges 38 arranged in parallel and spaced apart in the first direction D1. An adjacent pair of the first edges 36 may have respective tips opposed to each other and connected to respective tips of a pair of the second edges 36. The outer edge of the upper surface 34 may include a third edge 40 (FIG. 3), between the pair of second edges 38, farther in the second direction D2 from the side surface than the first edge 36, the third edge 40 extending along the first direction D1.

The upper surface 34 of at least one of the pair of buried layers 24 (e.g., each of the first buried layer 26 and the second buried layer 28) may have recesses 42. Each recess 42 may be surrounded by a second edge 38 and a third edge 40. The recesses 42 in the first buried layer 26 may be some first recesses 44 arranged in the first direction D1. The recesses 42 in the second buried layer 28 may be some second recesses 46 arranged in the first direction D1.

The first recesses 44 and the second recesses 46 may be line-symmetrical. As shown in FIG. 1, a straight-line L extending in the first direction on the mesa-stripe structure 12 may be an axis of symmetry. Each first recess 44 and a corresponding one of the second recesses 46 may be adjacent to each other in the second direction D2.

Each recess 42 may have a second slope surface 48. The second slope surface 48 may slope down from the upper surface 34. The second slope surface 48 may slope down from the second edge 38 more gently than the first upright surface 32. That is, an upper end of the second slope surface 48 may be the second edge 38 and may extend along the second direction D2. The second slope surface 48 may be a pair of second slope surfaces 48 opposed to each other. The second slope surface 48 may be a crystal face.

Each recess 42 may have a second upright surface 50 standing straight. The upper end of the second upright surface 50 may extend along the first direction D1. The second upright surface 50 may slope down from the third edge 40. That is, the upper end of the second upright surface 50 may be the third edge 40. The second upright surface 50 may be a crystal face.

Each recess 42 may have a bottom surface 52. The bottom surface 52 may spread in the first direction D1 from a lower end of the second slope surface 48. The bottom surface 52 may be flat and may be connected to the first slope surface 30.

The semiconductor optical device may have an insulating film 54. The insulating film 54 may be on the upper surface 34 of each of the pair of buried layers 24. The insulating film 54 may overhang the first upright surface 32. The insulating film 54 may overhang the second upright surface 50. The buried layer 24 may be monocrystalline at a portion in contact with the insulating film 54.

The insulating film 54 may stay away from the top surface of the mesa-stripe structure 12, thereby separating the insulating film 54 into a pair of portions. Alternatively, the insulating film 54 may be continuous. For example, on the top surface of the mesa-stripe structure 12, at an end in the first direction D1, there may be part of the insulating film 54, which may connect a pair of portions of the insulating film 54.

The insulating film 54 may have cut-out sections 56, in a plan view, depressed in the second direction D2 along the second edge 38 from the mesa-stripe structure 12. The recesses 42 may be inside the respective cut-out sections 56. The cut-out section 56 may have a width, in the first direction D1, uniform irrespective of how far from the mesa-stripe structure 12. The cut-out sections 56 may be line-symmetrical about a straight-line L passing through the mesa-stripe structure 12.

The semiconductor optical device may have an electrode film 58. The electrode film 58 may spread over the top surface of the mesa-stripe structure 12, the first slope surface 30 of the buried layer 24, and the insulating film 54. The buried layer 24 may be monocrystalline at a portion in contact with the electrode film 58. The electrode film 58 may include a first portion 60 on the first slope surface 30. The electrode film 58 may include a second portion 62 on the second slope surface 48.

The electrode film 58 may include a first connect portion 64 in front of the first upright surface 32. There may be a gap between the first connect portion 64 and the first upright surface 32. The first connect portion 64 may be thinner than any one of the first portion 60 and the second portion 62. The electrode film 58 may include a second connect portion 66 in front of the second upright surface 50. There may be a gap between the second connect portion 66 and the second upright surface 50. The second connect portion 66 may be thinner than any one of the first portion 60 and the second portion 62.

The entire electrode film 58 may comprise the same material and structure. The electrode film 58 may include a top electrode 68 on the insulating film 54. The top electrode 68 may serve as an external electrical connection area. The entire top electrode 68 may be on the insulating film 54. The insulating film 54 may be located between the buried layer 24 and the top electrode 68. The top electrode 68 may not reach an edge, in the second direction D2, of the semiconductor optical device and an edge of the insulating film 54 may be exposed, but the top electrode 68 may be disposed over the entire upper surface 34 of the semiconductor optical device.

The electrode film 58 may include a mesa electrode 70 on the top surface of the mesa-stripe structure 12. The mesa electrode 70 may be long rectangular in shape. The mesa electrode 70 may be electrically and physically connected to the p-type contact layer 22, making them at the same potential. Another layer may be interposed between them, such as when they are semiconductors of the same conductivity as the p-type contact layer 22 and the p-type clad layer 20. The mesa electrode 70 may be connected to the top electrode 68 through the first portion 60 and the first connect portion 64. The first connect portion 64 may be thinner than the top electrode 68.

The electrode film 58 may include a lead-out electrode 72 extending from the first portion 60 in the second direction D2. The lead-out electrode 72 may be inside the cut-out section 56 of the insulating film 54. The buried layer 24 may be also located directly below the lead-out electrode 72. The lead-out electrode 72 may be connected to the top electrode 68 through the second portion 62. The second portion 62 may be thicker than any one of the first connect portion 64 and the second connect portion 66 to ensure electrical connection.

The semiconductor optical device may have a counter electrode 74. The counter electrode 74 may be located on a surface (back surface), opposite to the protrusion 16, of the semiconductor substrate 12. The counter electrode 74 almost entirely covers the back surface of the semiconductor substrate 14. The counter electrode 74 may be at the same potential as the semiconductor substrate 14, and another layer may be interposed between them, as long as it is a semiconductor of the same conductivity type as the semiconductor substrate 14. When the semiconductor optical device is a semiconductor laser, by injecting a current between the electrode film 58 and the counter electrode 74, light may be generated in the multiple quantum well layer 18 and oscillated.

Figure 5:
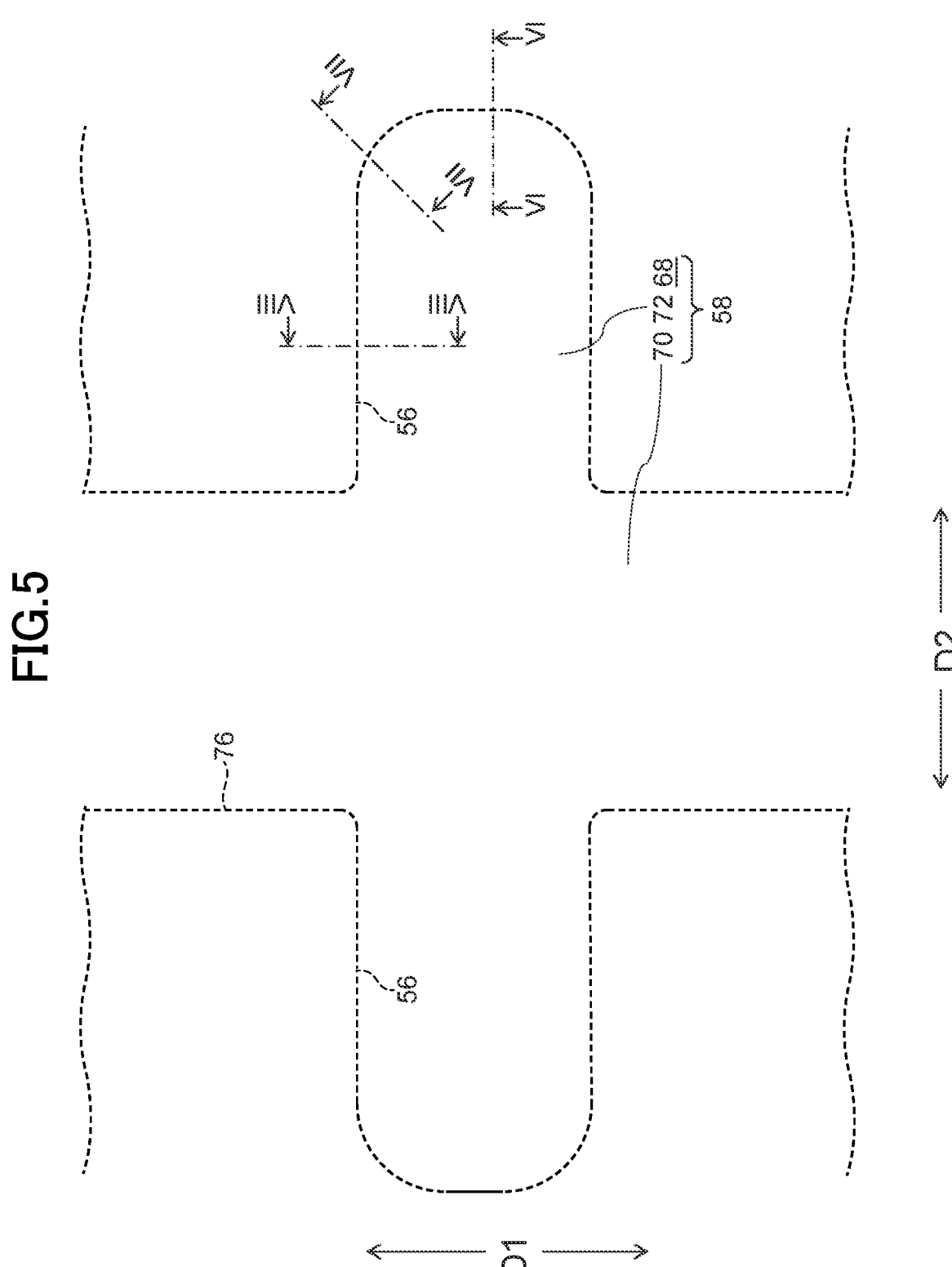
FIG. 5 is an enlarged plan view of an area, including a cut-out section of an insulating film, of the semiconductor optical device in FIG. 1.
Figure 6:
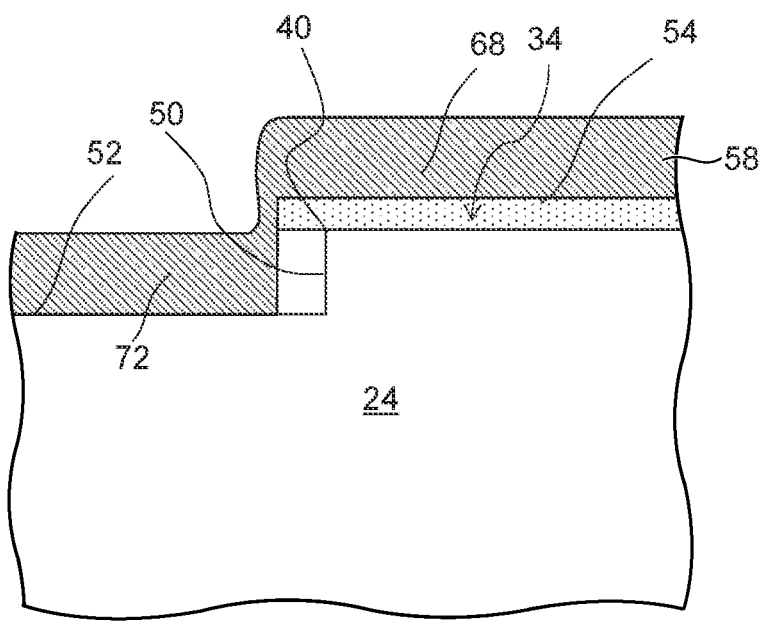
FIG. 6 is a VI-VI cross-sectional view of the semiconductor optical device in FIG. 5.
Figure 7:
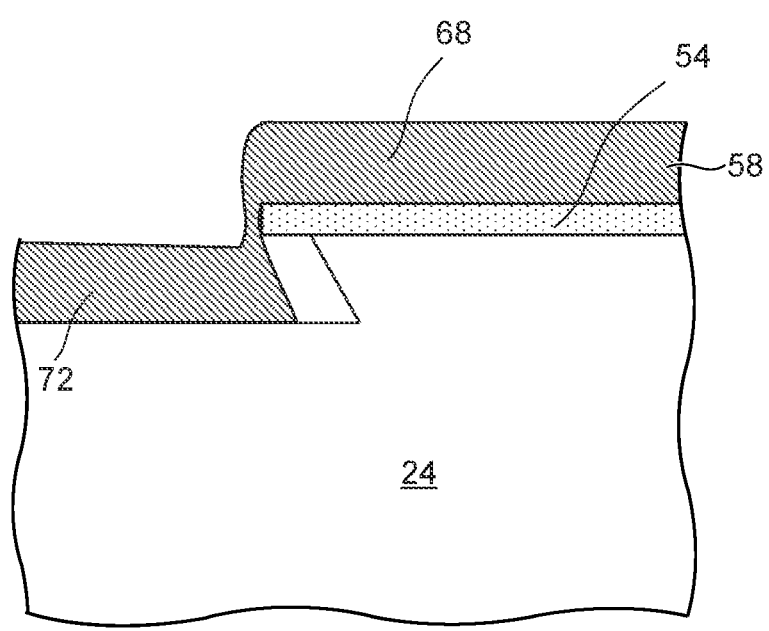
FIG. 7 is a VII-VII cross-sectional view of the semiconductor optical device in FIG. 5.
Figure 8:
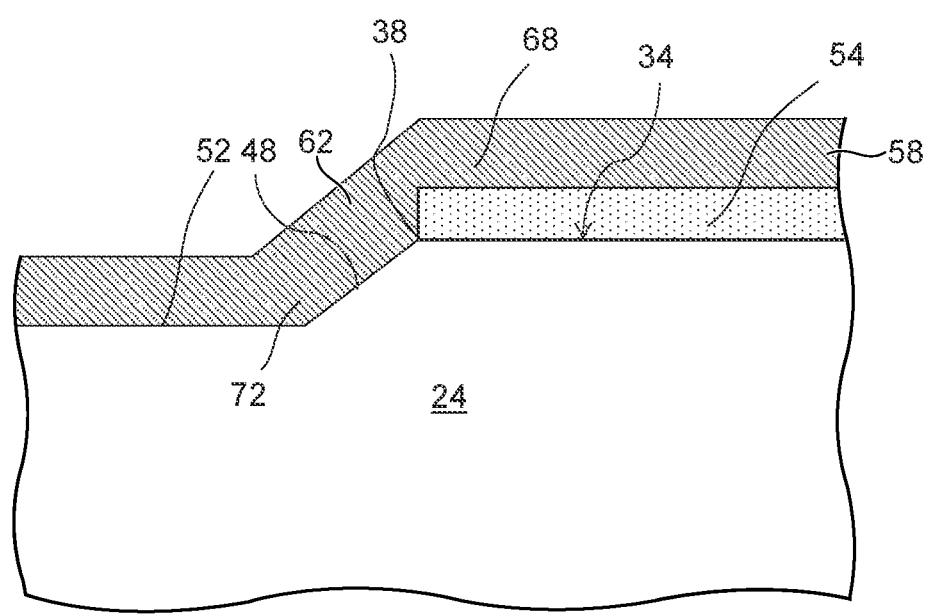
FIG. 8 is a VIII-VIII cross-sectional view of the semiconductor optical device in FIG. 5.

FIG. 5 is an enlarged plan view of an area, including the cut-out section 56 of the insulating film 54, of the semiconductor optical device in FIG. 1. FIG. 6 is a VI-VI cross-sectional view of the semiconductor optical device in FIG. 5. FIG. 7 is a VII-VII cross-sectional view of the semiconductor optical device in FIG. 5. FIG. 8 is a VIII-VIII cross-sectional view of the semiconductor optical device in FIG. 5.

The cut-out section 56 may be formed by partially masking and partially removing the insulating film 54. The removal may be done by etching. Even when the mask is polygonal in shape, the insulating film 54 may be etched to have a rounded corner shape regardless of its sharp corners. Alternatively, a mask in a rounded corner shape may be used.

The cut-out section 56 may be part of a through-hole 76. The through-hole 76 may be an opening formed in or separating the insulating film 54 to physically connect the electrode film 58 to the mesa-stripe structure 12. The through-hole 76 may include a mesa opening surrounding the top surface of the mesa-stripe structure 12 and the first slope surface 30 of the buried layer 22, and the mesa opening may be rectangular in shape.

In processes from partial removal of insulating film 54 to formation of electrode film 58, the buried layer 24 under the insulating film 54 may also be etched. As a result, there may be a height difference (step) between the surface of the insulating film 54 and the surface of the buried layer 24. Moreover, the etching of the buried layer 24 may result in a side-etching phenomenon (FIGS. 2 and 6) under the tip of the insulating film 54 along the first direction D1. Therefore, the insulating film 54 may overhang from the first edge 36 (FIG. 2) and the third edge 40 (FIG. 6). The electrode film 58 may be formed on the buried layer 24 in this shape and the insulating film 54, whereby the first connect portion 64 and the second connect portion 66 of the electrode film 58 may be made thinner (e.g., ⅕ or less) than the top electrode 68. In the worst case, they may become discontinuous (broken).

As shown in FIG. 7, the buried layer 24 may be subject to the side-etching phenomenon also under the tip, of the insulating film 54, that may extend in a direction intersecting both the first direction D1 and the second direction D2. Moreover, the etched surface may be an overhanging surface that leans forward and upward due to the crystal face. Therefore, here, too, the electrode film 58, at a portion connecting the top electrode 68 and the lead-out electrode 72, may become thinner. Depending on thickness of the lead-out electrode 72 and size of the step, the electrode film 58 may be broken.

By contrast, as shown in FIG. 8, the insulating film 54 may not protrude from the second edge 38. This may be because the buried layer 24 may have the second slope surface 48 due to the crystal face. The second slope surface 48 may slope, more gently than the first upright surface 32, down from the second edge 38. Therefore, there may be a small height difference (a step) between the surface of the insulating film 54 and the surface (second slope surface 48) of the buried layer 24. As a result, the electrode film 58 may extend smoothly and continuously through the second slope surface 48. Then, the second portion 62 overlapping with the second slope surface 48 may be thicker than half of the top electrode 68 or the lead-out electrode 72.

In an area without the cut-out section 56, the electrode film 58 may become thinner between the top electrode 68 and the mesa electrode 70, as in the first connect portion 64 in FIG. 2, resulting in a higher resistance and causing higher power consumption for driving the semiconductor optical device. Furthermore, heat generated in the mesa-stripe structure 12 may be dissipated by being transmitted to the top electrode 68 through the mesa electrode 70, but a thin region (e.g., first connect portion 64) of the electrode film 58 may be a factor to poor thermal conductivity.

However, according to the example implementation, the top electrode 68 may be connected to the mesa electrode 70 through the second portion 62, and the second portion 62 may be thicker due to presence of the second slope surface 48, therefore ensuring electrical connection. Furthermore, more than one cut-out section 56 may be formed to lower the resistance between the top electrode 68 and the mesa electrode 70, and to ensure a heat dissipation path. Even when the first connect portion 64 or the second connect portion 66 are discontinuous, continuity of the electrode film 58 may be ensured through the second portion 62.

Figure 9:
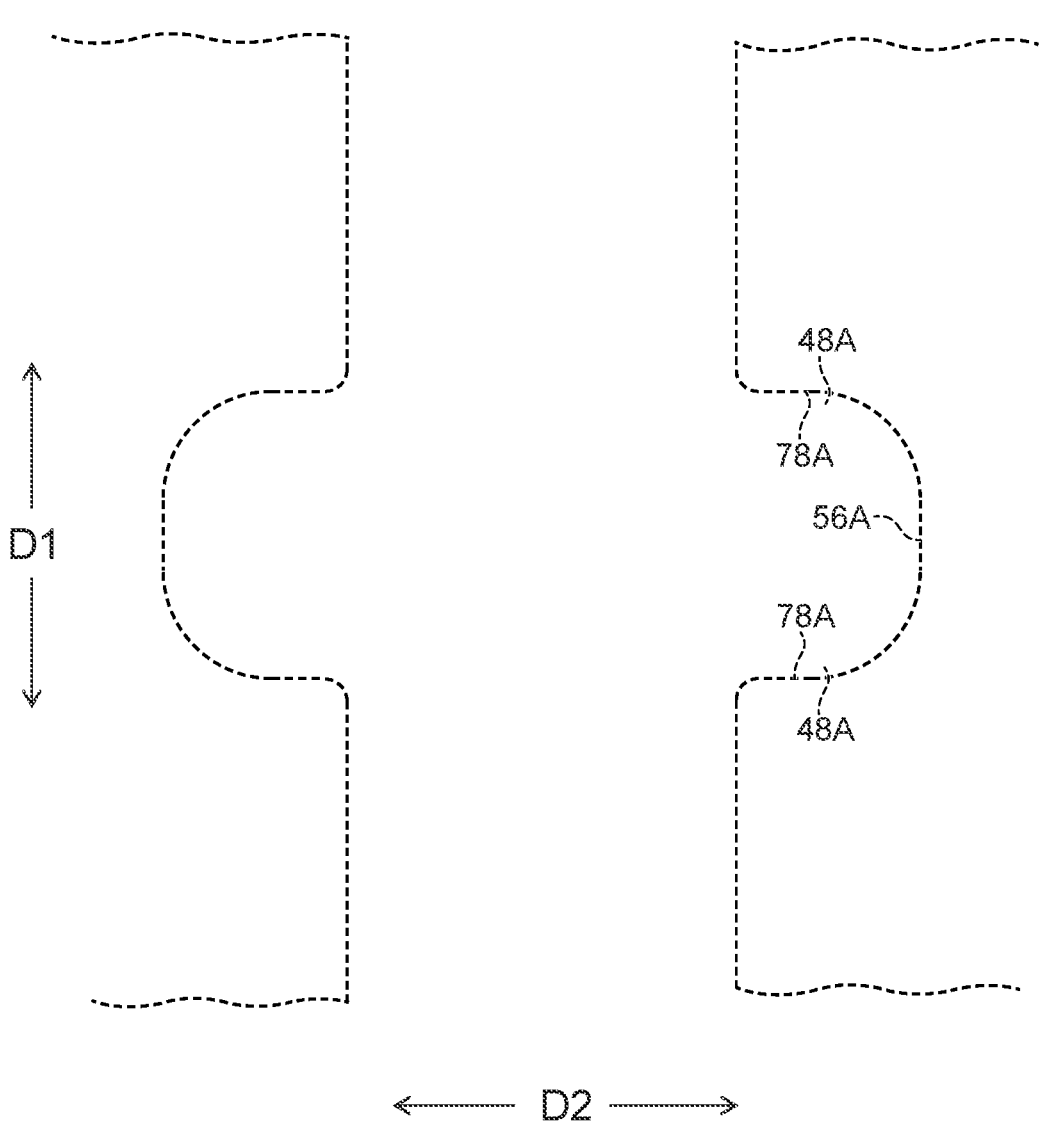
FIG. 9 is a plan view of a cut-out section of an insulating film in the semiconductor optical device according to variant 1.

FIG. 9 is a plan view of a cut-out section of an insulating film in the semiconductor optical device according to variant 1. The cut-out section 56A in FIG. 9 may be shorter in the second direction D2 than the cut-out section 56 in FIG. 5. Therefore, a straight edge 78A, along the second direction D2, of the cut-out section 56A may be shortened, and the second slope surface 48A of the buried layer 24 may be narrowed, accordingly. However, when the second slope surface 48A has an enough width, the electrode film 58 may not have an increased resistance, and the effect of the first example implementation may be obtained. The cut-out section 56A (straight edge 78A along the second direction D2) may have a length of 3 μm or more in the second direction D2.

Figure 10:
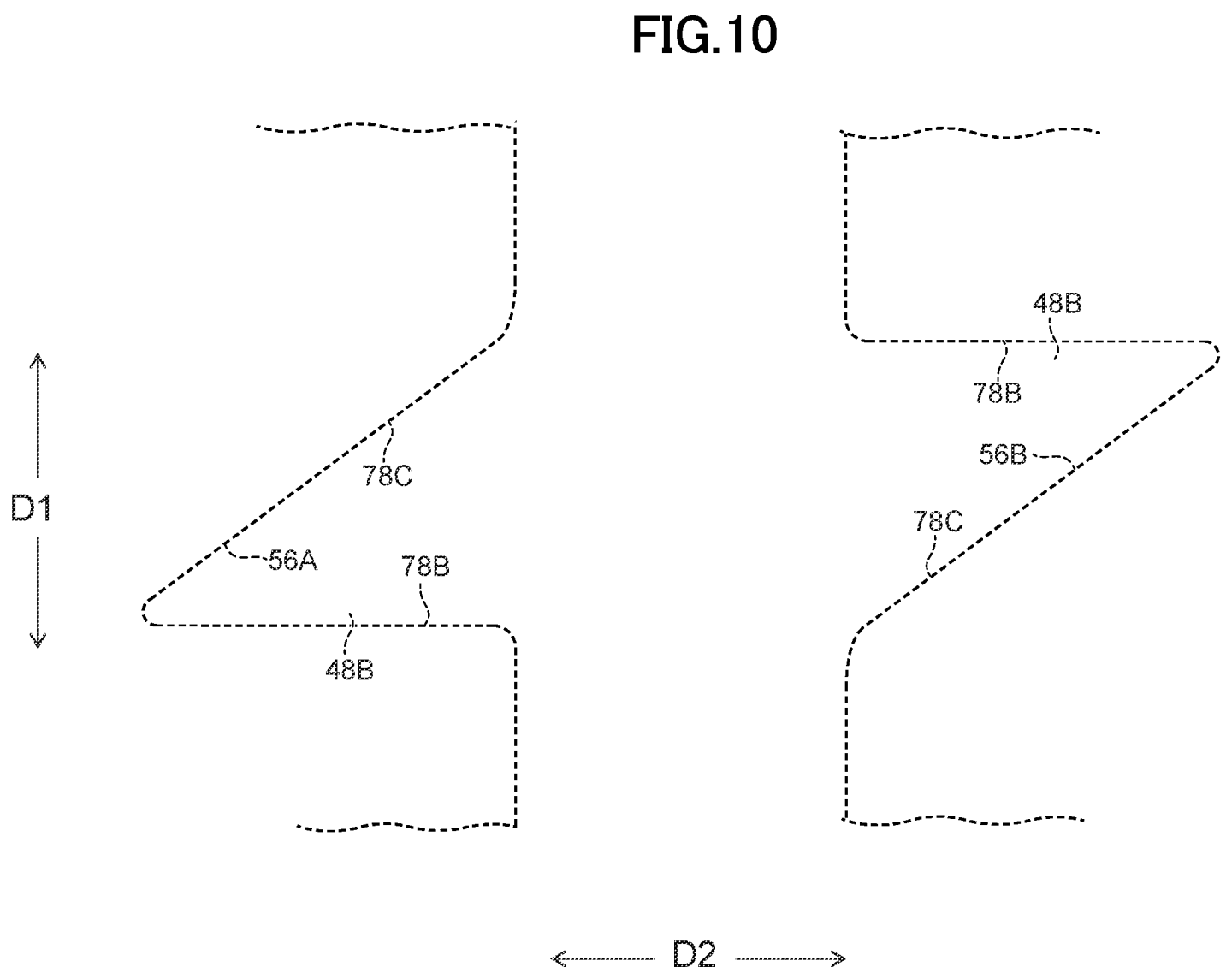

FIG. 10 is a plan view of a cut-out section of an insulating film in the semiconductor optical device according to variant 2. The cut-out section 56B may have a smaller width at a portion farther from the mesa-stripe structure 12 in the first direction D1. The cut-out section 56B may include a straight edge 78B along the second direction D2 and a diagonal edge 78C intersecting both the first direction D1 and the second direction D2. The buried layer 24 may have the second slope surface 48B adjacent to the straight edge 78B but does not always may have a slope surface adjacent to the diagonal edge 78C. Therefore, the electrode film may be continuous with a thick connect portion only at the portion through the straight edge 78B.

In FIG. 10, the pair of cut-out sections 56B may be not symmetric with respect to a line. That is, the cut-out section 56B on the right side may have a straight edge 78B on the upper side and a diagonal edge 78C on the lower side, while the cut-out section 56B on the left side may have a straight edge 78B on the lower side and a diagonal edge 78C on the upper side. As a variation, a pair of cut-out sections 56B may be line-symmetrical.

Figure 11:
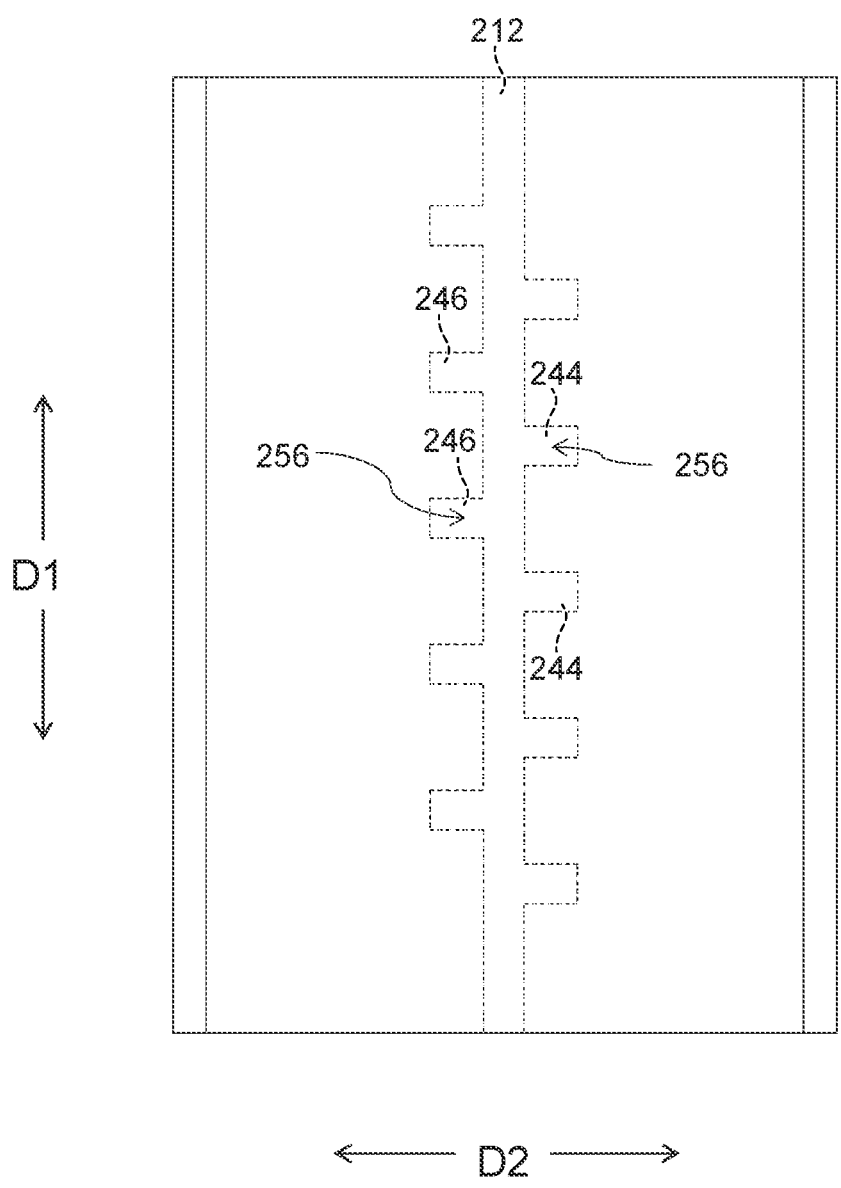
FIG. 11 is a plan view of a semiconductor optical device according to a second example implementation.

FIG. 11 is a plan view of a semiconductor optical device according to a second example implementation. The first recesses 244 and the second recesses 246 may be not symmetric with respect to a line. The cut-out sections 256 may be also not line-symmetrical about a straight-line along the mesa-stripe structure 212.

The first recesses 244 and the second recesses 246 may be arranged in a zigzag pattern in the first direction D1. The first recesses 244 may include a pair of first recesses 244 adjacent to each other in the first direction D1. An area between the pair of first recesses 244 may be adjacent, in the second direction D2, to a corresponding one of the second recesses 246. The second recesses 246 may include a pair of second recesses 246 adjacent to each other in the first direction D1. An area between the pair of second recesses 246 may be adjacent, in the second direction D2, to a corresponding one of the first recesses 244. In other respects, the description in the first example implementation may be applicable.

Figure 12:
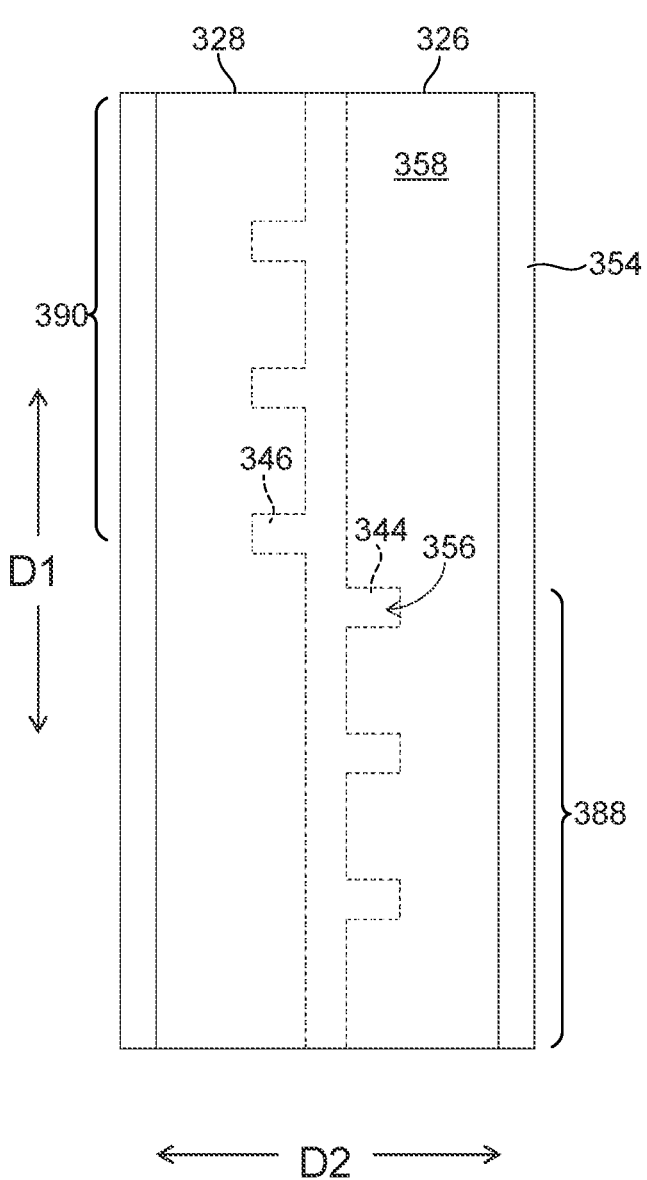
FIG. 12 is a plan view of a semiconductor optical device according to a third example implementation.

FIG. 12 is a plan view of a semiconductor optical device according to a third example implementation. The first recesses 344 and the second recesses 346 may be not symmetric with respect to a line. The first recesses 344 may be in a first region 388 of the upper surface of the first buried layer 326. The second recesses 346 may be in a second region 390 of the upper surface of the second buried layer 328. The first region 388 and the second region 390 may not be adjacent to each other in the second direction D2. The cut-out sections 356 may also not be symmetric with respect to a line.

To downsize the semiconductor optical device, the buried layer may be narrower in width in the second direction D2. The cut-out sections 356 may be located in upper left and lower right regions.

A wire may be bonded to the electrode film 358 for external connection. The wire may have a wider diameter at a tip, which should not overlap with the cut-out section 356. The cut-out section 356 creates a step between the insulating film 354 and the buried layer, reducing connection strength of wire bonding in such a stepped area.

In this example implementation, an area for a wire to be bonded may be narrower because the width of the buried layer may be narrower in the second direction D2, but there may be no cut-out section 356 in upper right and lower left, so an area for wire bonding may be secured. In other respects, the description in the first example implementation may be applicable.

Figure 13:
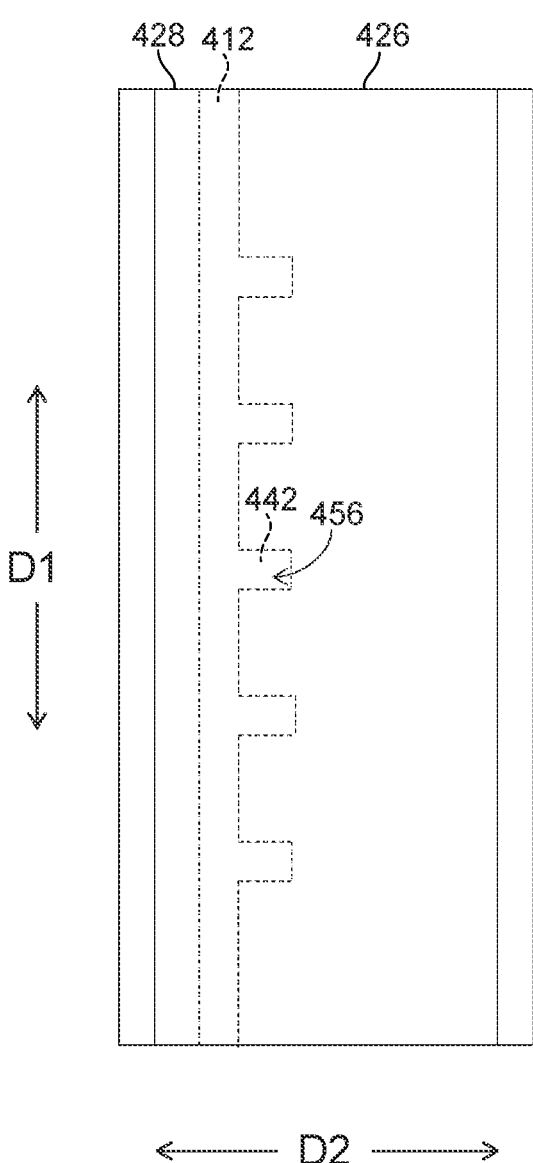
FIG. 13 is a plan view of a semiconductor optical device according to a fourth example implementation.

FIG. 13 is a plan view of a semiconductor optical device according to a fourth example implementation. The pair of buried layers may be a first buried layer 426 including the recesses 442 and a second buried layer 428 without recesses 442. The first buried layer 426 may be larger in width in the second direction D2 than the second buried layer 428.

The mesa-stripe structure 412 may be off-center of the semiconductor optical device in the second direction D2. The cut-out section 456 may be located on only one side of the mesa-stripe structure 412. The cut-out section 456 may be off-center of the mesa-stripe structure 412, securing a wide wire bonding area. The cut-out section 456 may be formed on a side for the wire bonding, securing electrical connection to transmit electrical signals input through the wire to the mesa-stripe structure 412. In other respects, the description in the first example implementation may be applicable.

Figure 14:
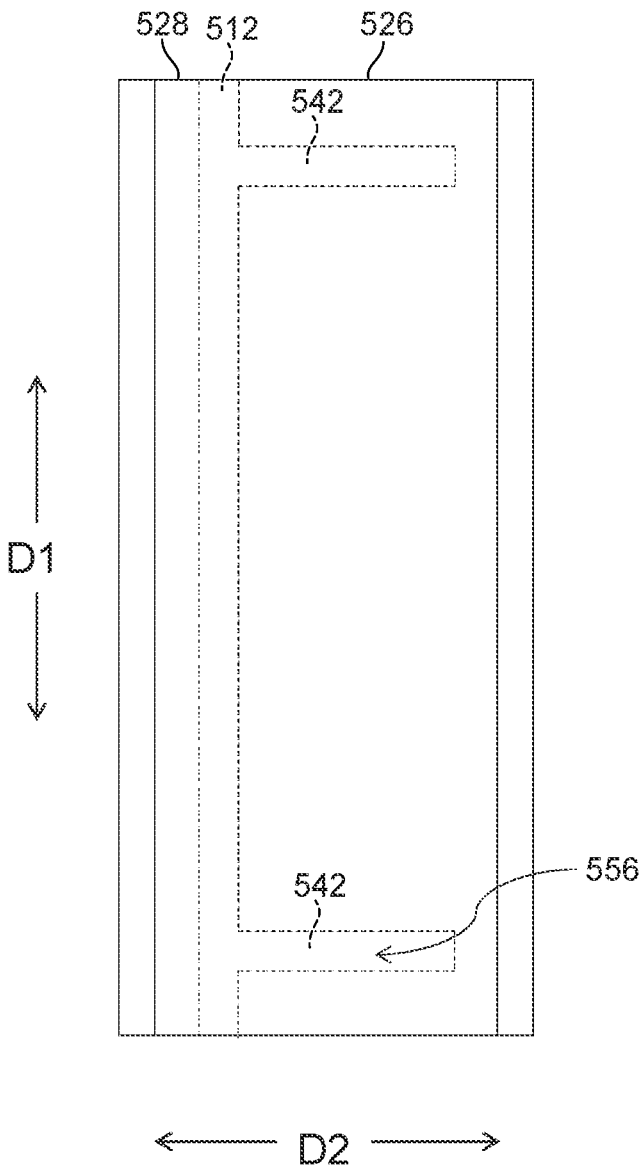
FIG. 14 is a plan view of a semiconductor optical device according to a fifth example implementation.

FIG. 14 is a plan view of a semiconductor optical device according to a fifth example implementation. The pair of buried layers may be a first buried layer 526 including recesses 542 and a second buried layer 528 without recesses. The first buried layer 526 may be larger in width in the second direction D2 than the second buried layer 528. The recesses 542 in the first buried layer 526 may be a pair of recesses 542. The spacing between the pair of recesses 542 may be greater than half of a length of the first buried layer 526 in the first direction D1.

The mesa-stripe structure 512 may be off-center of the semiconductor optical device in the second direction D2. The cut-out section 556 may be located on only one side of the mesa-stripe structure 512. The cut-out section 556 may be located near two end faces of the semiconductor optical device and may be longer in the second direction D2 than in other embodiments. A wire may be bonded in the area sandwiched between the pair of cut-out sections 556. In other respects, the description in the first example implementation may be applicable.

Figure 15:
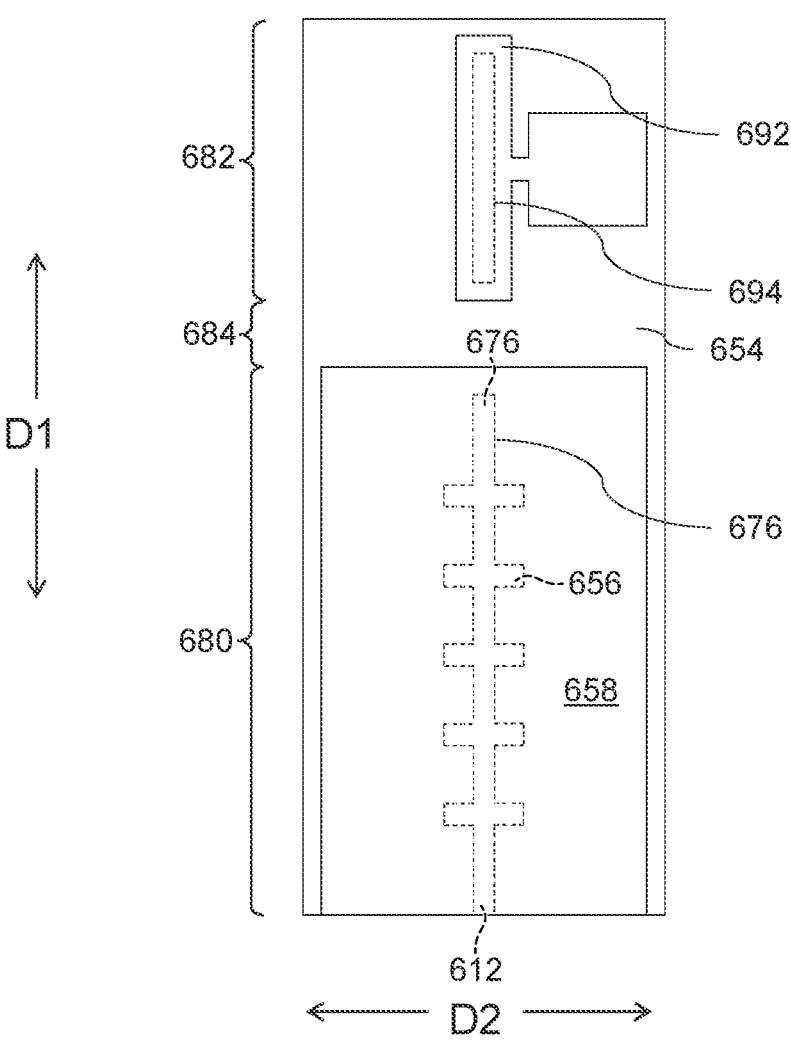
FIG. 15 is a plan view of a semiconductor optical device according to a sixth example implementation.

FIG. 15 is a plan view of a semiconductor optical device according to a sixth example implementation. The semiconductor optical device may be a modulator-integrated semiconductor laser where a semiconductor laser 680, an electro-absorption modulator 682, and a waveguide 684 disposed between them may be integrally integrated. The semiconductor optical device may have a mesa-stripe structure 612 across the semiconductor laser 680, the waveguide 684, and the electro-absorption modulator 682.

The semiconductor laser 680 may include a portion of the mesa-stripe structure 612. The semiconductor laser 680 may be configured to emit continuous light toward the waveguide 684. The semiconductor laser 680 may be any one of a distributed feedback (DFB) laser, a Fabry-Perot (FP) laser, a distributed Bragg reflector (DBR) laser, and a distributed reflector (DR) laser, being configured to oscillate in a 1.3 micrometers (μm) band or a 1.55 μm band. However, the wavelength band may not be limited to these, and other wavelength bands are also acceptable.

In the semiconductor laser 680, the insulating film 654 may have a through-hole 676 along a direction in which the mesa-stripe structure 612 may extend. The electrode film 658 may be on the insulating film 654. The electrode film 658 may be in contact with the top surface of the mesa-stripe structure 612 in the through-hole 676.

The electro-absorption modulator 682 may include another portion of the mesa-stripe structure 612. The electro-absorption modulator 682 may be capable of converting the continuous light transmitted through the waveguide 684 into modulated light. The electro-absorption modulator 682 may have a modulator electrode 692. In the electro-absorption modulator 682, the insulating film 654 may have a through-hole 694 along the direction in which the mesa-stripe structure 612 may extend. Here, the through-hole 694 may be rectangular, but as in the semiconductor laser 680, the insulating film 654 may have a cut-out section 656.

The waveguide 684 may include yet another portion of the mesa-stripe structure 612. The waveguide 684 may be capable of transmitting the light emitted by the semiconductor laser 680 toward the electro-absorption modulator 682. The waveguide 684 may be entirely covered with the insulating film 654.

An edge, closer to the waveguide 684 in the first direction D1, of the electrode film 658 may be positioned beyond the through-hole 676 in the insulating film 654. The edges of the electrode film 658 and the through-hole 676 may be aligned with each other, but if the edge of the electrode film 658 fails to be outside the through-hole 676 due to manufacturing variation, the contact layer, which may be the top surface of the mesa-stripe structure 612 may be exposed. As the contact layer may be a semiconductor layer, it may be susceptible to deterioration from external factors, which could affect its reliability. Therefore, the electrode film 658 may be configured to cover the through-hole 676 without fail, taking manufacturing variations into account.

This example implementation improves continuity of the electrode film 658 of the semiconductor optical device with a buried heterostructure. This may be achieved by having the through-hole 676 in the insulating film 654 provided with the cut-out sections 656. In detail, the buried layer may have a second slope surface, inside the cut-out section 656, that slopes in the first direction D1 in which the mesa-stripe structure 612 may extend. The electrode film 658 may have a portion on the second slope surface, and the portion may have a thickness greater than half of another portion on the upper surface of the buried layer. Thus, the portion of the electrode film 658 passing through the second slope surface securely connects the portion on the upper surface of the buried layer and the portion inside the cut-out section 656.

Two or more cut-out sections 656 may be arranged along the mesa-stripe structure 612. The cut-out sections 656 may be arranged to be line-symmetrical or not symmetric with respect to a line. The cut-out sections 656 may be arranged on only one side of the mesa-stripe structure 612. In other respects, the description in the first example implementation may be applicable.

The embodiments described above are not limited, and different variations are possible. The structures explained in the embodiments may be replaced with substantially the same structures and other structures that can achieve the same effect or the same objective.

In a first implementation, a semiconductor optical device includes: a mesa-stripe structure 12 extending in a first direction D1; a pair of buried layers 24 configured to bury the mesa-stripe structure 12 on both sides, each of the buried layers 24 including a first slope surface 30 that is adjacent to and slopes upward from a top surface of the mesa-stripe structure 12, each of the buried layers 24 including a first upright surface 32 that stands straight from an upper end of the first slope surface 30, each of the buried layers 24 including an upper surface 34 that is higher than the top surface of the mesa-stripe structure 12; an insulating film 54 on the upper surface 34 of each of the pair of buried layers 24, avoiding the top surface of the mesa-stripe structure 12; and an electrode film 58 over the top surface of the mesa-stripe structure 12, the first slope surface 30, and the insulating film 54, the first upright surface 32 including an upper end that extends along the first direction D1, the upper surface 34 of at least one of the pair of buried layers 24 including some recesses 42, each of the recesses 42 including a second slope surface 48 that slopes downward from the upper surface 34, the second slope surface 48 including an upper end that extends along a second direction D2 perpendicular to the first direction D1.

Even though the electrode film 58 becomes thinner in front of the first upright surface 32 of the buried layer 24, its thickness is maintained from the upper surface 34 to the second slope surface 48, thereby preventing an increase in resistance and a decrease in heat dissipation, thereby preventing a degradation of characteristics.

In a second implementation, alone or in combination with the first implementation, wherein the electrode film 58 includes a first portion 60 over the first slope surface 30, a second portion 62 over the second slope surface 48, and a first connect portion 64 in front of the first upright surface 32, the first connect portion 64 being thinner than any one of the first portion 60 and the second portion 62.

In a third implementation, alone or in combination with one or more of the first and second implementations, wherein there is a gap between the first connect portion 64 and the first upright surface 32.

In a fourth implementation, alone or in combination with one or more of the first through third implementations, wherein the insulating film 54 overhangs the first upright surface 32.

In a fifth implementation, alone or in combination with one or more of the first through fourth implementations, wherein each of the recesses 42 further includes a second upright surface 50, the second upright surface 50 has an upper end extending along the first direction D1, the electrode film 58 further includes a second connect portion 66 in front of the second upright surface 50, and the second connect portion 66 is thinner than any one of the first portion 60 and the second portion 62.

In a sixth implementation, alone or in combination with one or more of the first through fifth implementations, wherein there is a gap between the second connect portion 66 and the second upright surface 50.

In a seventh implementation, alone or in combination with one or more of the first through sixth implementations, wherein the insulating film 54 overhangs the second upright surface 50.

In an eighth implementation, alone or in combination with one or more of the first through seventh implementations, wherein each of the recesses 42 has a bottom surface 52 extending in the first direction D1 from a lower end of the second slope surface 48, and the bottom surface 52 is flat and connected to the first slope surface 30.

In a ninth implementation, alone or in combination with one or more of the first through eighth implementations, wherein the pair of buried layers 24 are a first buried layer 26 and a second buried layer 28 each including recesses 42, the recesses 42 in the first buried layer 26 are first recesses 44 arranged in the first direction D1, and the recesses 42 in the second buried layer 28 are second recesses 46 arranged in the first direction D1.

In a tenth implementation, alone or in combination with one or more of the first through ninth implementations, wherein the first buried layer 26 and the second buried layer 28 are equal in width in the second direction D2.

In an eleventh implementation, alone or in combination with one or more of the first through tenth implementations, wherein the first recesses 44 and the second recesses 46 are line-symmetrical, and a straight-line L extending in the first direction D1 on the mesa-stripe structure 12 is an axis of symmetry.

In a twelfth implementation, alone or in combination with one or more of the first through eleventh implementations, wherein each of the first recesses 44 and a corresponding one of the second recesses 46 are adjacent to each other in the second direction D2.

In a thirteenth implementation, alone or in combination with one or more of the first through twelfth implementations, wherein the first recesses 244 and the second recesses 246 are not symmetric with respect to a line.

In a fourteenth implementation, alone or in combination with one or more of the first through thirteenth implementations, wherein the first recesses 244 and the second recesses 246 are arranged in a zigzag pattern in the first direction D1.

In a fifteenth implementation, alone or in combination with one or more of the first through fourteenth implementations, wherein the first recesses 244 include a pair of first recesses 244 adjacent to each other in the first direction D1, an area between the pair of first recesses 244 is adjacent to a corresponding one of the second recesses 246 in the second direction D2, the second recesses 246 include a pair of second recesses 246 adjacent to each other in the first direction D1, and an area between the pair of second recesses 246 is adjacent to a corresponding one of the first recesses 244 in the second direction D2.

In a sixteenth implementation, alone or in combination with one or more of the first through fifteenth implementations, wherein the first recesses 344 are in a first region 388 of the upper surface of the first buried layer 326, the second recesses 346 are in a second region 390 of the upper surface of the second buried layer 328, and the first region 388 and the second region 390 are not adjacent to each other in the second direction D2.

In a seventeenth implementation, alone or in combination with one or more of the first through sixteenth implementations, wherein the pair of buried layers may be a first buried layer 426 including the recesses 442 and a second buried layer 428 without the recesses 442, and the first buried layer 426 may be larger than the second buried layer 428 in width in the second direction D2.

In an eighteenth implementation, alone or in combination with one or more of the first through seventeenth implementations, wherein the recesses 542 in the first buried layer

526 are a pair of recesses 542, and a gap between the pair of recesses 542 is greater than half of a length of the first buried layer 526 in the first direction D1.

In a nineteenth implementation, alone or in combination with one or more of the first through eighteenth implementations, wherein the second slope surface 48 is a pair of second slope surfaces 48 opposed to each other.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:
1. A semiconductor optical device comprising:
a mesa-stripe structure extending in a first direction;

a pair of buried layers configured to bury the mesa-stripe structure on both sides, each of the buried layers including a first slope surface that is adjacent to and slopes upward from a top surface of the mesa-stripe structure, each of the buried layers including a first upright surface that stands straight from an upper end of the first slope surface, each of the buried layers including an upper surface that is higher than the top surface of the mesa-stripe structure;

an insulating film on the upper surface of each of the pair of buried layers, avoiding the top surface of the mesa-stripe structure; and an electrode film over the top surface of the mesa-stripe structure, the first slope surface, and the insulating film, the first upright surface including an upper end that extends along the first direction, the upper surface of at least one of the pair of buried layers including some recesses, each of the recesses including a second slope surface that slopes downward from the upper surface, the second slope surface including an upper end that extends along a second direction perpendicular to the first direction.

2. The semiconductor optical device of claim 1, wherein the electrode film includes a first portion over the first slope surface, a second portion over the second slope surface, and a first connect portion in front of the first upright surface, the first connect portion being thinner than any one of the first portion and the second portion.

3. The semiconductor optical device of claim 2, wherein there is a gap between the first connect portion and the first upright surface.

4. The semiconductor optical device of claim 3, wherein the insulating film overhangs the first upright surface.

5. The semiconductor optical device of claim 2, wherein each of the recesses further includes a second upright surface, the second upright surface has an upper end extending along the first direction, the electrode film further includes a second connect portion in front of the second upright surface, and the second connect portion is thinner than any one of the first portion and the second portion.

6. The semiconductor optical device of claim 5, wherein there is a gap between the second connect portion and the second upright surface.

7. The semiconductor optical device of claim 6, wherein the insulating film overhangs the second upright surface.

8. The semiconductor optical device of claim 1, wherein:

each of the recesses has a bottom surface extending in the first direction from a lower end of the second slope surface, and the bottom surface is flat and connected to the first slope surface.

9. The semiconductor optical device of claim 1, wherein the pair of buried layers are a first buried layer and a second buried layer each including recesses, the recesses in the first buried layer are first recesses arranged in the first direction, and the recesses in the second buried layer are second recesses arranged in the first direction.

10. The semiconductor optical device of claim 9, wherein the first buried layer and the second buried layer are equal in width in the second direction.

11. The semiconductor optical device of claim 9, wherein:

the first recesses and the second recesses are line-symmetrical, and a straight-line extending in the first direction on the mesa-stripe structure is an axis of symmetry.

12. The semiconductor optical device of claim 11, wherein each of the first recesses and a corresponding one of the second recesses are adjacent to each other in the second direction.

13. The semiconductor optical device of claim 9, wherein the first recesses and the second recesses are not symmetric with respect to a line.

14. The semiconductor optical device of claim 13, wherein the first recesses and the second recesses are arranged in a zigzag pattern in the first direction.

15. The semiconductor optical device of claim 13, wherein:

the first recesses include a pair of first recesses adjacent to each other in the first direction, an area between the pair of first recesses is adjacent to a corresponding one of the second recesses in the second direction, the second recesses include a pair of second recesses adjacent to each other in the first direction, and an area between the pair of second recesses is adjacent to a corresponding one of the first recesses in the second direction.

16. The semiconductor optical device of claim 13, wherein:

the first recesses are in a first region of the upper surface of the first buried layer, the second recesses are in a second region of the upper surface of the second buried layer, and the first region and the second region are not adjacent to each other in the second direction.

17. The semiconductor optical device of claim 1, wherein:

the pair of buried layers are a first buried layer including the recesses and a second buried layer without the recesses, and the first buried layer is larger than the second buried layer in width in the second direction.

18. The semiconductor optical device of claim 17, wherein:

the recesses in the first buried layer are a pair of recesses, and a gap between the pair of recesses is greater than half of a length of the first buried layer in the first direction.

19. The semiconductor optical device of claim 1, wherein the second slope surface is a pair of second slope surfaces opposed to each other.

* * * * *